(12) United States Patent
Jeon

(10) Patent No.: US 11,049,559 B1
(45) Date of Patent: Jun. 29, 2021

(54) SUBTHRESHOLD VOLTAGE FORMING OF SELECTORS IN A CROSSPOINT MEMORY ARRAY

(71) Applicant: SanDisk Technologies LLC, Addison, TX (US)

(72) Inventor: Yoocharn Jeon, Palo Alto, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/899,423

(22) Filed: Jun. 11, 2020

(51) Int. Cl.
*G11C 13/00* (2006.01)

(52) U.S. Cl.
CPC ...... *G11C 13/0038* (2013.01); *G11C 13/0004* (2013.01); *G11C 13/0026* (2013.01); *G11C 13/0028* (2013.01); *G11C 13/0061* (2013.01)

(58) Field of Classification Search
None
See application file for complete search history.

(56) References Cited

U.S. PATENT DOCUMENTS

| | | | |
|---|---|---|---|
| 7,529,124 B2 | 5/2009 | Cho et al. | |
| 8,693,233 B2 | 4/2014 | Scheuerlein et al. | |
| 8,737,111 B2 | 5/2014 | Kreupl et al. | |
| 9,613,698 B2 | 4/2017 | Mantegazza et al. | |
| 10,373,682 B2 * | 8/2019 | Parkinson | G11C 13/0028 |
| 10,714,534 B1 * | 7/2020 | Bandyopadhyay | H01L 29/7841 |
| 2010/0091561 A1 * | 4/2010 | Lowrey | G11C 13/0004 365/163 |
| 2014/0098594 A1 * | 4/2014 | Azuma | G11C 13/0007 365/148 |
| 2015/0213844 A1 * | 7/2015 | Nguyen | G11C 13/0038 365/226 |
| 2019/0147955 A1 * | 5/2019 | Chen | G11C 16/10 365/185.23 |
| 2020/0111518 A1 * | 4/2020 | Ge | G11C 11/24 |
| 2020/0258572 A1 * | 8/2020 | Bandyopadhyay | G11C 7/12 |
| 2020/0342926 A1 * | 10/2020 | Katine | G11C 11/1657 |
| 2020/0411589 A1 * | 12/2020 | Wan | H01L 43/12 |
| 2021/0065791 A1 * | 3/2021 | Grobis | G11C 13/0069 |

OTHER PUBLICATIONS

Zhou, et al., "Crossbar RRAM Arrays: Selector Device Requirements During Read Operation," IEEE Transactions on Electron Devices, May 2014, 9 pages.
Zhu, et al., "Ovonic threshold switching selectors for three-dimensional stackable phase-change memory," MRS Bulletin, Sep. 2019, 7 pages.

* cited by examiner

*Primary Examiner* — Khamdan N. Alrobaie
(74) *Attorney, Agent, or Firm* — Vierra Magen Marcus LLP

(57) ABSTRACT

Apparatuses and techniques are described for forming of selectors in a memory device such as a crosspoint memory array. A threshold switching selector is in series with a resistance-switching memory cell in a storage node. Prior to a first switching operation in the array, a stimulus is applied to the storage node to transform the selectors from an initial state having an initial threshold voltage to an operating state having a lower, operating threshold voltage. The stimulus can include a signal having a voltage which does not exceed the operating threshold voltage. To limit peak current consumption, the stimulus can be applied to different subsets of the array, one subset at a time.

20 Claims, 12 Drawing Sheets

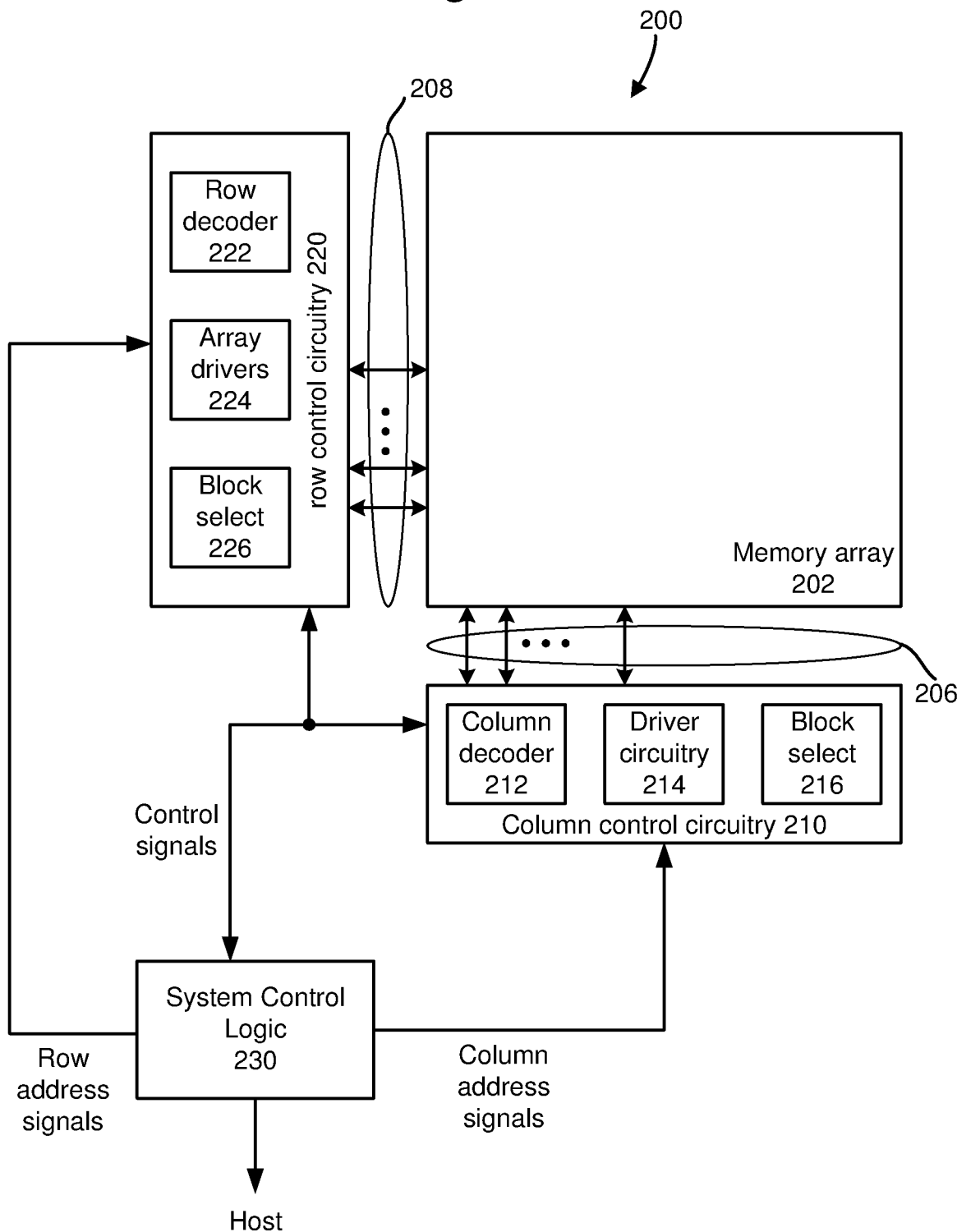

Fig. 5

| Material | Vhold | Vop |
|---|---|---|
| Ge-Se | 0.5 | 1.4 |
| Ge-Se-N | 1.0 | 4.0 |
| Ge-Se-As | 1.2 | 3.5 |
| Ge-Se-Sb-N | 0.7 | 2.2 |
| $Ge_{58}Se_{42}$ | 1.7 | 3.5 |
| $GeTe_6$ | 0.7 | 1.6 |
| Si-Te | n.a. | 1.2 |
| Zn-Te | 0.4 | 0.6 |
| C-Te | 0.3 | 0.6 |
| B-Te | 0.3 | 0.7 |
| Ge-As-Te-Si-N | 1.5 | 1.8 |
| Ge-As-Se-Te-Si | 1.5 | 2.2 |

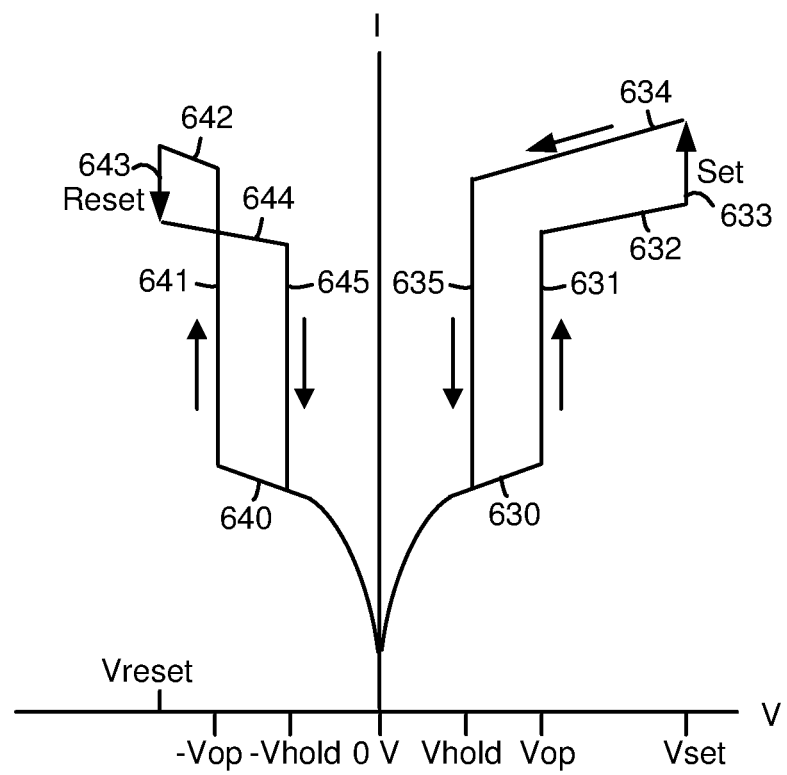

SUBTHRESHOLD VOLTAGE FORMING OF SELECTORS IN A CROSSPOINT MEMORY ARRAY

BACKGROUND

The present technology relates to the operation of storage and memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

The memory devices can include memory cells arranged in crosspoint arrays, where each memory cell is at the intersection of a bit line and a word line. However, various challenges are presented in operating such memory devices.

BRIEF DESCRIPTION OF THE DRAWINGS

FIG. 2 depicts a block diagram of an example memory system which can use the cross-point memory arrays of memory cells of FIGS. 1B and 1C.

FIG. 5 depicts a table of example materials for a threshold switching selector, along with a holding threshold voltage, Vhold, and an operating threshold voltage, Vop.

FIG. 6C depicts an example I-V plot for a storage node comprising the bipolar switching memory cell of FIG. 6A in series with the threshold switching selector of FIG. 6B.

DETAILED DESCRIPTION

Figure 1A:
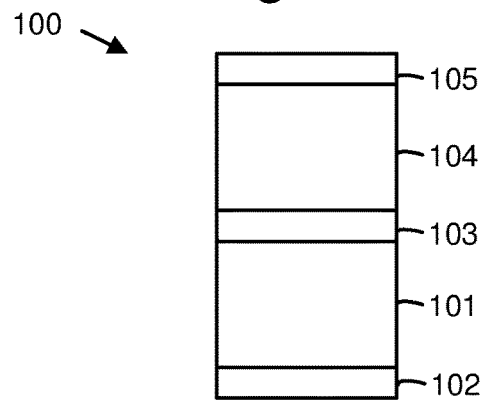
FIG. 1A depicts a cross-sectional view of an example storage node comprising a memory cell in series with a selector.

Apparatuses and techniques are described for forming of selectors in a memory device such as a crosspoint memory array.

Crosspoint memory arrays have become increasingly popular due to advantages such as fast, random access of non-volatile memory, with high density. A crosspoint memory array comprises memory cells arranged in a grid, in rows and columns, at the intersection of word lines and bit lines. The memory cells can be arranged in one or more levels. See, e.g., FIGS. 1B, 1C, 3 and 9. A portion of the memory cells can be accessed by selecting a subset of the rows and/or columns.

Each memory cell is in series with a selector in a storage node of the array. See, e.g., FIG. 1A. The selector allows access to a selected memory cell during program or read operations while preventing sneak currents from passing through other, unselected memory cells. For memory cells which can be read and written with a low current, such as dynamic random access memory (DRAM) and flash memories, a relatively small field-effect transistor (FET) can be used as a selector.

However, emerging memory technologies such as magnetoresistive random access memory (MRAM), phase change memory (PCM) and resistive random access memory (RRAM) require a higher current to operate. Each of these types of memory cells store data according to a switchable resistance state of the memory cells. Typically, one bit is stored per cell, although some technologies allow for more than one bit per cell. MRAM cells store data in different magnetic domains.

PCM cells include a phase change material which can be set in different phases or states which have different resistance levels. The state is maintained when no power is supplied so that the memory cells are non-volatile. Phase change materials include chalcogenides, carbon polymers, perovskites, and certain metal oxides (MeOx) and metal nitrides (MeN). The switching mechanism for PCM cells involves generating sufficient Joule heating to cause an amorphous-to-crystalline phase change (a set operation) or a crystalline-to-amorphous phase change (a reset operation). The PCM cell has a relatively low resistance while in the crystalline state and a relatively high resistance while in the amorphous state. The switching mechanism for ReRAM cells involves applying a voltage to the cell which forms a filament or conductive path in a thin oxide layer to lower the cell's resistance. After a memory cell is programmed, a read operation can be performed to determine the data state stored in the memory cell.

To handle the higher current of the emerging memory technologies, it is not practical to use a large selector that can drive such a current at each storage node. Instead, threshold switching selectors are considered to be better candidates because they can be fabricated with the same form factor as the memory cells and can handle a relatively high current. A threshold switching selector has a high resistance (in an off or non-conductive state) when it is biased to a voltage lower than its threshold voltage, and a low resistance (in an on or conductive state) when it is biased to a voltage higher than its threshold voltage. The threshold switching selector remains on until its current is lowered below a holding current, or the voltage is lowered below a holding voltage. When this occurs, the threshold switching selector returns to the off state. Accordingly, to program a memory cell in a storage node, a voltage is applied which is sufficient to turn on the associated threshold switching selector and set or reset the memory cell. See FIG. 6A-6C.

However, when a threshold switching selector is turned on for the first time in the lifetime of the memory device, after the memory device is fabricated, typically during testing by the manufacturer, the threshold voltage is substantially higher than in subsequent uses of the selector. The voltage which is required to turn on the selector during the first use, referred to as a first-fire voltage, is substantially higher than the voltage which is required to turn on the selector during second and other subsequent uses. This is due to a transformation which takes place when a threshold switching selector is turned on for the first time. The state of the selector is transformed from an initial amorphous state having an initial threshold voltage (Vinit) to an operating state having an operating threshold voltage (Vop) which is lower than the initial threshold voltage. The transformation results in a permanent, irreversible decrease in the threshold voltage of the selector. The transformation, referred to as a forming process, is a structural change which may be due to thermal effects of the selector material.

Since the forming process has required a first-fire voltage which is greater than Vinit, the circuitry of the memory device has to be sized to handle the relatively large voltage/current which is involved in the forming. This is true even though the forming process is a one-time event in the lifetime of the memory device. This requirement increases the size of the memory device since the driver circuits that drive the rows and columns of an array have to be sized to carry the voltage and current for the target cells and the sum of all leakage currents for a selected row and column. These drivers take up a relatively large area of the silicon substrate and limit the capacity of the memory device.

Techniques provided herein address the above and other issues. In one approach, a forming process for a threshold switching selector is provided in which a voltage applied to the selector is less than the initial threshold voltage and/or the operating threshold voltage. The forming process involves applying a stimulus or stress such as a subthreshold voltage/current for a predetermined duration to the selectors before regular operations such as programming and read are performed for the memory cells of the array.

The forming process reduces the threshold voltage of the selector from the initial threshold voltage to the operating threshold voltage. The process allows for a reduced size of the circuitry since the circuitry can be sized to turn on the selector based on the operating threshold voltage. A stimulus signal having specified characteristics can be applied to the selector. The specified characteristics can include a specified period of time, voltage and current which are sufficient to complete the forming process while maintaining the voltage below the initial and/or operating threshold voltage. See FIG. 8A.

In one approach, each selector in an array can be formed concurrently by applying the stimulus concurrently to all of the rows and columns of the array. Or, to reduce the current used in forming, different subsets of the selectors in the array can be formed at different times, one subset at a time. For example, the stimulus can be applied to a subset of the rows and all of the columns, all of the rows and a subset of the columns, or a subset of the rows and a subset of the columns See FIGS. 8B and 9.

These and other features are discussed further below.

FIG. 1A depicts a cross-sectional view of an example storage node comprising a memory cell in series with a selector. A memory array can be made up of a large number of storage nodes. The example storage node 100 comprises a memory cell 101 between electrodes 102 and 103, and a selector 104 between the electrode 103 and an electrode 105. The selector can be in any position relative to the memory cell, such as above, below or to the side. The selector is in series with the memory cell.

As mentioned, the memory cell may be reversibly switched between two or more states. For example, a memory cell may be in an initial high-resistivity (high resistance) state upon fabrication that is switchable to a low-resistivity state upon application of a first voltage and/or current. Application of a second voltage and/or current may return the memory cell to the high-resistivity state. Alternatively, the memory cell may be in an initial low-resistance state upon fabrication that is reversibly switchable to a high-resistance state upon application of the appropriate voltage(s) and/or current(s). One resistance state may represent a binary "0" while another resistance state may represent a binary "1." However, more than two data/resistance states may be used. The memory may comprise one or more reversible resistance-change materials. A variety of materials show reversible resistance-switching behavior, including chalcogenides, carbon polymers, perovskites, and certain metal oxides and nitrides such as metal oxide or nitride such as, for example, NiO, Nb2O5, TiO2, HfO2, Al2O3, MgOx, CrO2, VO, BN, and AlN. Examples of chalcogenides include any suitable compound of germanium (Ge), antimony (Sb) and tellurium (Te). One example is Ge2Sb2Te5.

The electrodes may be formed of a metal such as titanium (Ti) or titanium nitride (TiN).

The selector can comprise, e.g., an ovonic threshold switching material. Examples provided in FIG. 5 include Ge—Se, Ge—Se—N, Ge—Se—As, Ge—Se—Sb—N, Ge58Se42, GeTe6, Si—Te, Zn—Te, C—Te, B—Te, Ge—As—Te—Si—N, Ge—As—Se—Te—Si and Ge—Se—As—Te.

The selector controls access to the memory cells. In particular, to apply a voltage or current to a memory cell to change its resistance state, the corresponding selector must first be switched to a conductive state by applying a sufficiently high voltage, e.g., a voltage which is higher in magnitude than the operating threshold voltage. See also FIG. 6A-6C. When the selector is in a non-conductive state, e.g., when a voltage across the selector is lower in magnitude than the operating threshold voltage, the memory cell is isolated and retains its existing resistance state.

Figure 1B:
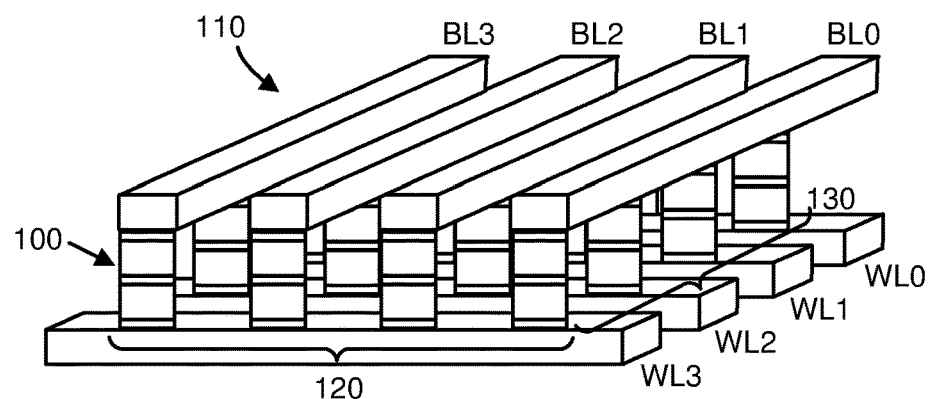
FIG. 1B depicts a perspective view of an example crosspoint memory array of memory cells in a 2D configuration, in which each storage node is connected to a word line and a bit line.

FIG. 1B depicts a perspective view of an example cross-point memory array 110 of memory cells in a 2D configuration, in which each storage node is connected to a word line and a bit line. The storage nodes are arranged in a single level in this example. In this simplified example, there are four word lines WL0-WL3 and four bit lines BL0-BL3. A row of storage nodes is associated with each word line, including a row 120 associated with WL3. A column of storage nodes is associated with each bit line, including a column 130 associated with BL0.

The word lines and bit lines comprise a conductive material such as tungsten or copper, any appropriate metal, heavily doped semiconductor material, a conductive silicide, a conductive silicide-germanide, or a conductive germanide In this example, the conductors are rail-shaped, the word lines extend parallel to one another and the bit lines extend parallel to one another. Additionally, the word lines extended perpendicularly to the bit lines.

Each storage node is located the intersection of a respective word line and bit line. For example, the storage node 100 is located the intersection of WL3 and BL3. To apply a voltage across the storage node, the control circuitry applies the voltage across WL3 and BL3.

Figure 1C:
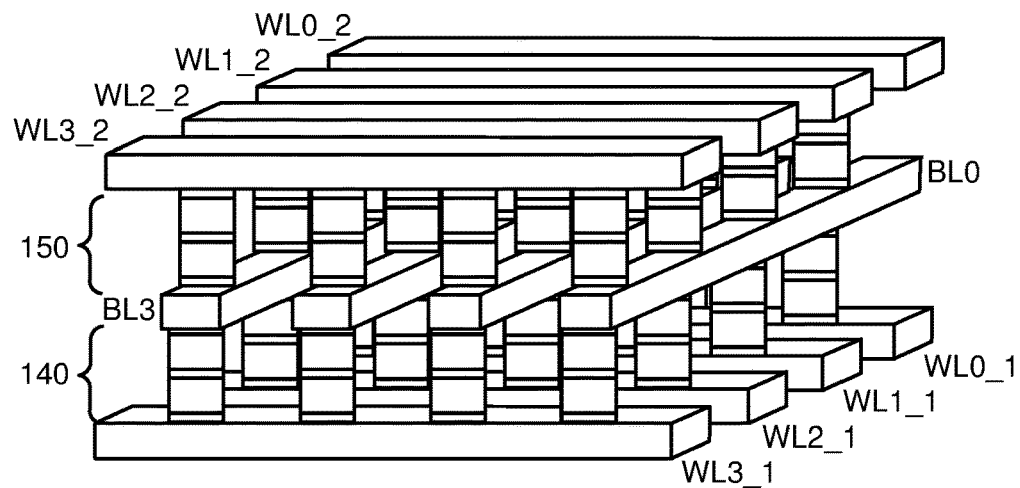
FIG. 1C depicts a perspective view of an example crosspoint memory array of memory cells arranged in two levels in 3D configuration.

FIG. 1C depicts a perspective view of an example cross-point memory array of memory cells arranged in two levels in 3D configuration. The storage nodes are arranged in a two levels, including a lower level 140 and an upper level 150, in this example. More than two levels could be used as well.

Each level includes a plurality of storage nodes in a cross-point memory array. Additionally, the bit lines BL0-BL3 may be shared by the lower and upper levels, for instance. The lower level includes word lines WL0_1 to WL3_1 and the upper level includes word lines WL0_2 to WL3_2.

The above examples show memory cells in a cylindrical or pillar shape and conductors in the shapes of rails. However, other options are possible.

FIG. 2 depicts a block diagram of an example memory system which can use the cross-point memory arrays of memory cells of FIGS. 1B and 1C. The memory system 200 includes a memory array 202 that can be a two- or three-dimensional array of memory cells as described above. In one embodiment, memory array 202 is a monolithic three-dimensional memory array, e.g., an array in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, The array terminal lines of memory array 202 include the various layer(s) of word lines organized as rows, and the various layer(s) of bit lines organized as columns. However, other orientations can also be implemented.

The memory system includes row control circuitry 220, whose outputs 208 are connected to respective word lines of the memory array 202. Row control circuitry 220 receives row address signals and various control signals from system control logic circuit 230, and typically may include such circuits as row decoders 222, array terminal drivers 224, and block select circuitry 226 for both read and programming (e.g., set and reset) operations. The memory system also includes column control circuitry 210 whose input/outputs 206 are connected to respective bit lines of the memory array 202. Column control circuitry 210 receives column address signals and various control signals from system control logic 230, and typically may include such circuits as column decoders 212, array terminal receivers or drivers 214, block select circuitry 216, as well as read/write circuitry, including sense amplifiers and I/O multiplexers. System control logic 230 receives data and commands from a host and provides output data to the host. In other embodiments, system control logic 230 receives data and commands from a separate controller circuit and provides output data to that controller circuit, with the controller circuit communicating with the host. System control logic 230 may include one or more state machines, registers and other control logic for controlling the operation of memory system 200.

In one embodiment, all of the components depicted in FIG. 2 are arranged on a single integrated circuit. For example, system control logic 230, column control circuitry 210 and row control circuitry 220 can be formed on the surface of a substrate and memory array 202 in a monolithic three-dimensional memory array formed above the substrate (and, therefore, above system control logic 230, column control circuitry 210 and row control circuitry 220). In some cases, a portion of the control circuitry can be formed on the same layers as some of the memory array.

Together with the circuitry in the memory system, external test equipment can be connected to the memory system to implement the techniques described herein, including forming of the selectors. Or, the techniques may be implemented fully within the memory system.

Figure 3:
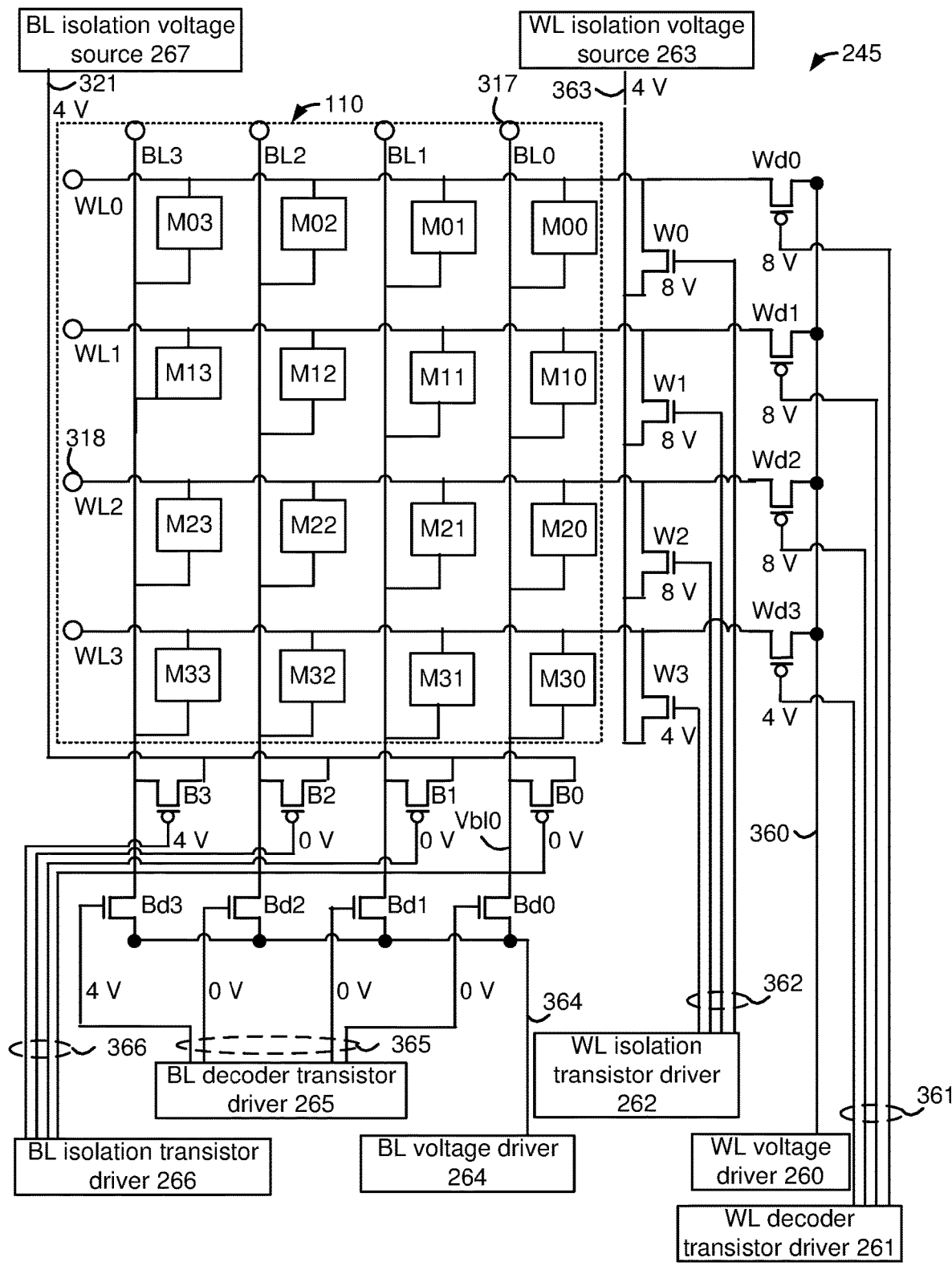
FIG. 3 depicts an example configuration of details of the memory system of FIG. 2.

FIG. 3 depicts an example configuration of details of the memory system of FIG. 2. The circuit is consistent with the example array of FIG. 1B. As mentioned, in this simplified example, the array 110 includes sixteen example storage nodes arranged in four rows and four columns, where each row is connected to a respective word line WL0-WL3 and each column is connected to a respective bit line BL0-BL3. Each storage node may be a two-terminal device in which one terminal is connected to a first control line (e.g., word line) and another terminal is connected to a second control line (e.g., bit line).

For example, storage nodes M00, M01, M02 and M03 are connected to WL0 and to bit lines B0, B1, B2 and B3, respectively, storage nodes M10, M11, M12 and M13 are connected to WL1 and to bit lines B0, B1, B2 and B3, respectively, storage nodes M20, M21, M22 and M23 are connected to WL2 and to bit lines B0, B1, B2 and B3, respectively, and storage nodes M30, M31, M32 and M33 are connected to WL3 and to bit lines B0, B1, B2 and B3, respectively.

Each bit line and word line can be terminated by an open circuit as depicted by the circular terminals including example terminals 317 and 318 for BL0 and WL2, respectively, in one approach.

In one approach, the unselected storage nodes which are connected to both unselected word lines and unselected bit lines can be biased at both of their terminals with an equal positive voltage (an isolation voltage) during a read or write operation to prevent the unselected memory cells from being read or written. An unselected storage node is a storage node which is not selected for a read or write operation. A selected memory cell is a memory cell which is selected for a read or write (program) operation. M33, connected to WL3 and BL3, is an example selected storage node corresponding to the storage node 100 in FIG. 1B. A selected storage node or memory cell is at the intersection of a selected bit line or column and a selected word line or row. Some of the unselected storage nodes (e.g., M30, M31 and M32) will be connected to a selected word line (WL3) and an unselected bit line (BL0, BL1 and BL2), while other unselected storage nodes (M03, M13, M23) are connected to an unselected word line (WL0, WL1 and WL2) and a selected bit line (BL3).

Access to the word lines is controlled by word line decoder transistors and word line isolation transistors. The circuit can operate in a unipolar or bipolar mode. The description below refers to a unipolar mode or to one switching direction or polarity of a bipolar mode. For the opposite switching direction or polarity of the bipolar mode, the roles of the WL voltage driver 260 and the WL decoder transistor driver 261 are swapped with the roles of the WL isolation voltage source 263 and the WL isolation transistor driver 262, respectively. Similarly, the roles of the BL voltage driver 264 and the BL decoder transistor driver 265 are swapped with the roles of the BL isolation voltage source 267 and the BL isolation transistor driver 266, respectively.

Word line decoder transistors Wd0-Wd3 such as p-channel MOSFETs are connected serially to WL0-WL3, respectively, to select or unselect the respective word line. The word line decoder transistors are connected between the memory cells and the WL voltage driver 260. With the example selected storage node M33, the decoder transistor Wd3 is selected, or provided in a conductive state, by applying a low control gate voltage such as 0 V from the WL decoder transistor driver 261. In this case, Wd3 allows a voltage from the WL voltage driver to reach WL3. At the same time, the word line decoder transistors Wd0, Wd1 and Wd2 may be unselected, or provided in a non-conductive state, by applying a higher control gate voltage such as 8 V from the WL decoder transistor driver 261. In this case, Wd0, Wd1 and Wd2 prevent the voltage from reaching WL0, WL1 and WL2, respectively. The sources of the WL decoder transistors Wd0-Wd3 can be connected to one another via a path 360.

Each word line WL0-WL3 is also connected in parallel to a word line isolation transistor W0-W3, respectively, which can be provided in a conductive state to pass an isolation voltage, e.g., 4 V on the path 363, to unselected word lines from the WL isolation voltage source 263. These transistors may be n-channel MOSFETs, in one approach, and have a source connected to a common voltage on a path 363. For the selected word line, WL3, W3 is provided in a non-conductive state, e.g., by applying a control gate voltage of 4 V, to disconnect the isolation voltage from the word line. For the unselected word lines, WL0, WL1 and WL2, W0, W1 and W2 are provided in a conductive state, e.g., by applying a control gate voltage of 8 V, to connect the isolation voltage to the respective word line.

Access to the bit lines is controlled by bit line decoder transistors and bit line isolation transistors.

Bit line decoder transistors Bd0-Bd3 such as n-channel MOSFETs are connected serially to BL0-BL3, respectively, to select or unselect the respective bit line. The bit line decoder transistors are connected between the memory cells and the BL voltage driver 264. During a read or write operation, the selected bit line can be connected to the bit line voltage driver 264 via the path 364 by providing the respective decoder transistor in a conductive state. For example, BL3 can be connected to the voltage driver 264 by providing Bd3 in a conductive state, e.g., by applying 4 V to its control gate. BL0-BL2 can be disconnected from the voltage driver 264 by providing Bd0-Bd2 in a non-conductive state, e.g., by applying 0 V to their control gates. The drains of Bd0-Bd3 can be connected to one another via a path 364.

Bit line isolation transistors B0-B3, which may be p-channel MOSFETs, are connected to the bit lines BL0-BL3, respectively, to pass an isolation or unselect voltage to the bit lines or disconnect the isolation voltage from the bit line. For a selected bit line such as BL3, the respective isolation transistor B3 is provided in a non-conductive state by providing a high voltage such as 4 V on the control gate. This prevents the isolation voltage on the path 321 from reaching BL3. For the unselected bit lines such as BL0-BL2, the respective isolation transistors B0-B2 are provided in a conductive state by providing a low voltage such as 0 V on their control gates. This connects the isolation voltage on the path 321 to BL1-BL3, respectively, and to unselected memory cells connected to those bit lines.

A forming operation can also be performed concurrently on all storage nodes in the array or on different subsets of storage nodes of the array. For example, consider a forming operation for a subset comprising the storage nodes M30-M33 connected to WL3. To apply a forming voltage to these storage nodes, the decoder transistor Wd3 is selected to allow a voltage from the WL voltage driver to reach WL3. At the same time, the word line decoder transistors Wd0, Wd1 and Wd2 may be unselected to prevent the voltage from reaching WL0, WL1 and WL2, respectively. Each bit line BL0-BL3 is connected to the bit line voltage driver 264 via the path 364 by providing the respective decoder transistors in a conductive state. The respective isolation transistors are provided in a non-conductive state. The various drivers can be part of the array drivers 224 of FIG. 2.

The circuit 245 is connected to the various voltage drivers. For example, the WL voltage driver 260 can provide a voltage on a path 360 which is connected to each of the WL decoder transistors. The WL decoder transistor driver 261 can provide separate voltage signals to the WL decoder transistors via paths 361. The WL isolation transistor driver 262 can provide separate voltage signals to the WL isolation transistors via paths 362. The WL isolation voltage source 263 can provide an isolation voltage such as 4 V to the WL isolation voltage transistors via a path 363.

The BL voltage driver 264 can provide a voltage on a path 364 which is connected to each of the BL decoder transistors. The BL decoder transistor driver 265 can provide separate voltage signals to the BL decoder transistors via paths 365. The BL isolation transistor driver 266 can provide separate voltage signals to the BL isolation transistors via paths 366. The BL isolation voltage source 267 can provide an isolation voltage such as 4 V to the BL isolation voltage transistors via a path 321.

In addition to the WL and BL voltage drivers, WL and BL program voltage drivers can similarly be provided for a program operation. The drivers can also be used for a forming process as described herein.

Figure 4A:
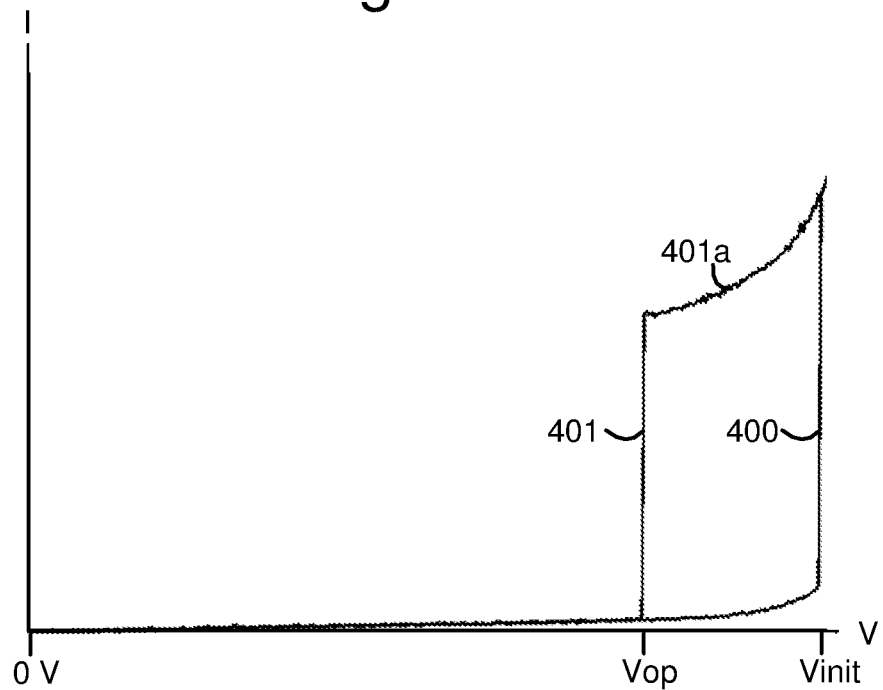
FIG. 4A depicts an I-V plot for a selector during a first switching operation (plot 400) and a second switching operation (plot 401) without a stimulus.

FIG. 4A depicts an I-V plot for a selector during a first switching operation (plot 400) and a second switching operation (plot 401) without a stimulus. In FIG. 4A-4H, the vertical axis depicts current (I) and the horizontal axis depicts voltage (V). Additionally, a common linear scale is used in the vertical axes, and a common linear scale is used in the horizontal axes.

As mentioned at the outset, without a stimulus as described herein, the selectors have a relatively high initial threshold voltage, Vinit, during a first operation in a memory array. When a voltage exceeding Vinit is applied to the selector, the selector turns on, as depicted by the plot 400. Also during this time, the selector undergoes a forming process in which its threshold voltage (Vth) is irreversibly reduced to a lower level referred to as the operation Vth (Vop). The change in Vth is irreversible in normal operation/storage conditions of the memory device. This can include, e.g., storage in temperatures of −40 C to 85 C, vibration of up to 20 G's at 10-2,000 Hz and shock at up to 1500 G's for 0.5 msec.

During subsequent operations in the memory array, the selectors turn on when a voltage exceeding Vop is applied to the selector, as depicted by the plot 401. The plot 401*a* represents an increase in the voltage across the storage node as needed to switch the resistance state of the memory cell.

The selector turns off when the voltage across it falls below a holding voltage, Vhold, as discussed further below.

This is a comparative example in which a high voltage of at least Vinit is required in the first operation of the array.

Figure 4B:
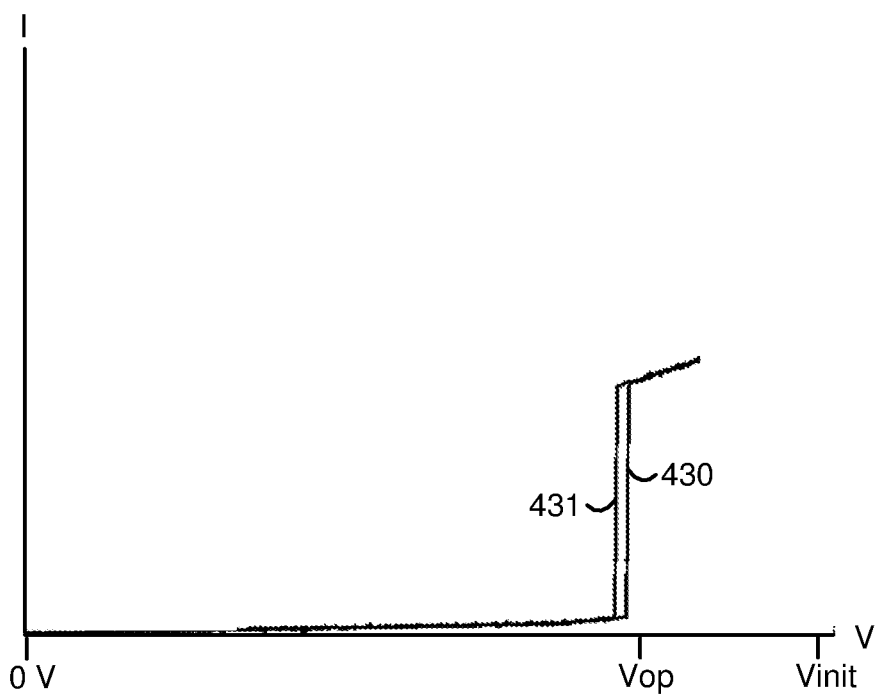
FIG. 4B depicts an I-V plot for a selector during a first switching operation (plot 430) and a second switching operation (plot 431) after a first stimulus.

FIG. 4B depicts an I-V plot for a selector during a first switching operation (plot 430) and a second switching operation (plot 431) after a first stimulus. The stimulus comprises a signal having a specified current, a specified voltage below Vop and a specified duration. The duration is relatively long compared to the time for a switching operation of a storage node. For example, the duration can be longer than the duration of a normal program or read operation, e.g., a program or read operation which occurs after the forming process. The duration could be one-half second, one second, or multiple seconds, e.g., 3, 5 or 10 seconds. The duration can be longer than one microsecond, one millisecond or one second. The duration depends on the material, structure, and fabrication process. The stimulus applies a stress to the selector in proportion to the current, voltage and duration.

In the various stimuli discussed, specific values for the current, voltage and duration depend on various factors such as the composition and thickness of the selector. For example, a stronger stimulus is appropriate when the thickness is greater.

After the stimulus is applied, the plots confirm that the turn on voltage is substantially equal to Vop for both the first and second operations. This demonstrates that the stimulus successfully reduced the Vth of the selector to Vop.

Figure 4C:
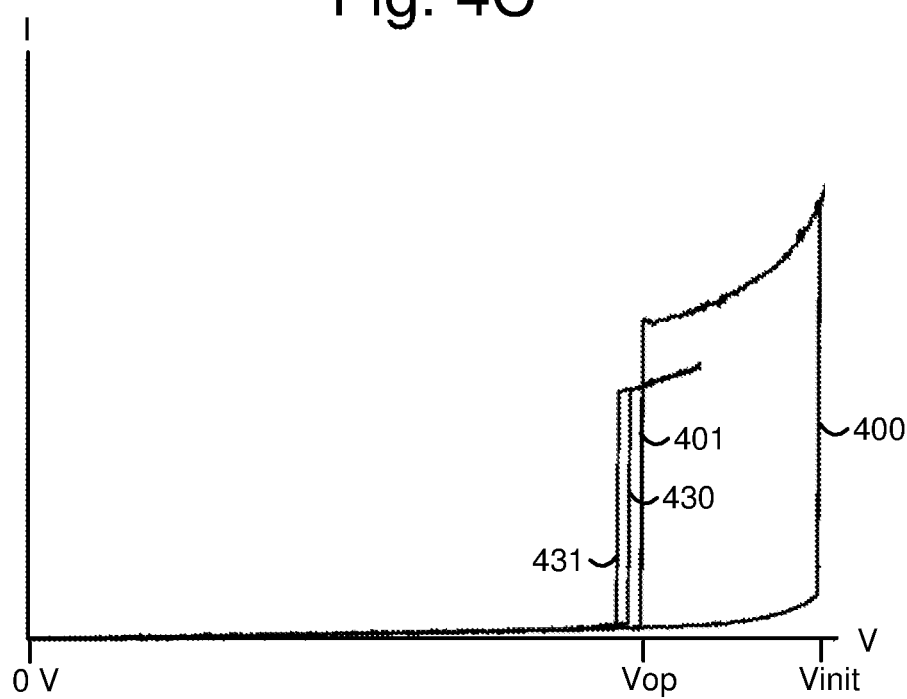
FIG. 4C depicts an I-V plot for a selector, comparing the plots 400 and 401 of FIG. 4A with the plots 430 and 431 of FIG. 4B.

FIG. 4C depicts an I-V plot for a selector, comparing the plots 400 and 401 of FIG. 4A (with no pre-operation stimulus) with the plots 430 and 431 of FIG. 4B (with a pre-operation stimulus). The plots 401, 430 and 431 are substantially the same and indicate the selector has a Vth and turn on voltage of Vop.

Figure 4D:
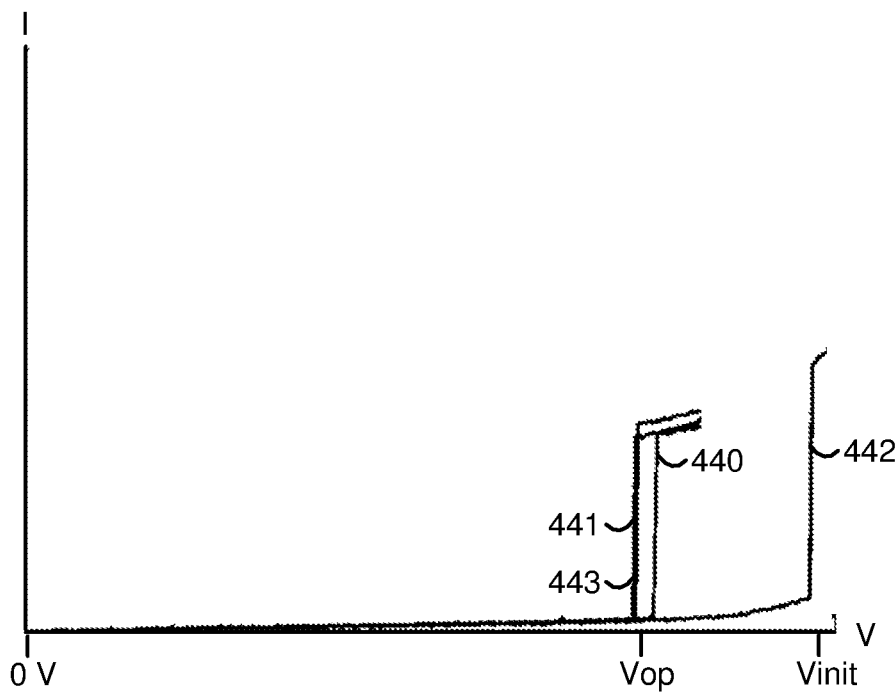
FIG. 4D depicts an I-V plot for a selector during a first switching operation (plot 440) and a second switching operation (plot 441) after a second stimulus, and a first switching operation (plot 442) and a second switching operation (plot 443) without a stimulus.

FIG. 4D depicts an I-V plot for a selector during a first switching operation (plot 440) and a second switching operation (plot 441) after a second stimulus, and a first switching operation (plot 442) and a second switching operation (plot 443) without a stimulus. The stimulus comprises a signal having a specified current which is $1/20^{th}$ the current used in the example of FIG. 4B and a duration which is four times the duration used in the example of FIG. 4B. The plots 440, 441 and 443 are substantially the same and indicate the selector has a Vth and turn on voltage of Vop. The plot 442 shows the higher turn on voltage of Vinit in the first switching operation without the stimulus.

After the stimulus is applied, the plots confirm that the turn on voltage is substantially equal to Vop for both the first and second operations. Additionally, the use of a smaller current in the stimulus signal is compensated for by a longer duration.

Figure 4E:
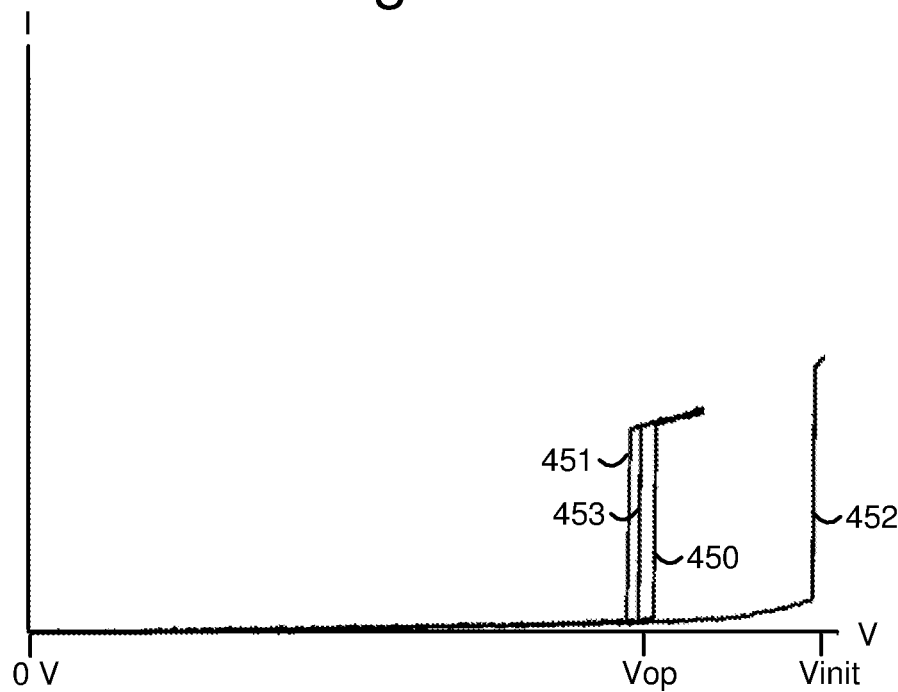
FIG. 4E depicts an I-V plot for a selector during a first switching operation (plot 450) and a second switching operation (plot 451) after a third stimulus, and a first switching operation (plot 452) and a second switching operation (plot 453) without a stimulus.

FIG. 4E depicts an I-V plot for a selector during a first switching operation (plot 450) and a second switching operation (plot 451) after a third stimulus, and a first switching operation (plot 452) and a second switching operation (plot 453) without a stimulus. The stimulus comprises a signal having a specified voltage which is about 80-90% of Vop and a specified duration of several seconds. The plots 450, 451 and 453 are substantially the same and indicate the selector has a Vth and turn on voltage of Vop. The plot 452 shows the higher turn on voltage of Vinit in the first switching operation without the stimulus. After the stimulus is applied, the plots confirm that the turn on voltage is substantially equal to Vop for both the first and second operations.

Figure 4F:
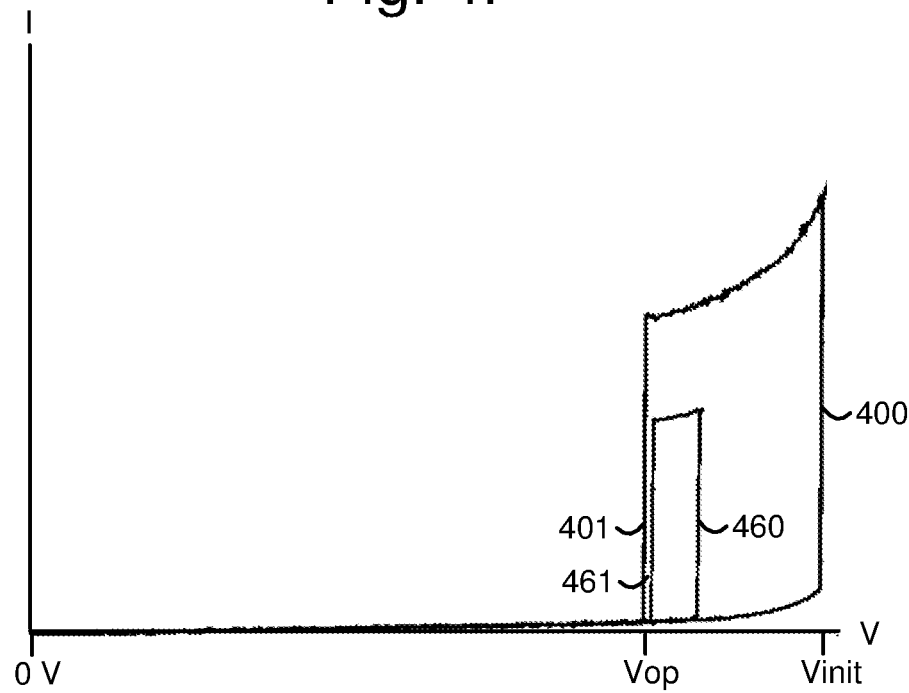
FIG. 4F depicts an I-V plot for a selector during a first switching operation (plot 460) and a second switching operation (plot 461) after a fifth stimulus, compared with the plots 400 and 401, respectively, of FIG. 4A.

FIG. 4F depicts an I-V plot for a selector during a first switching operation (plot 460) and a second switching operation (plot 461) after a fifth stimulus, compared with the plots 400 and 401, respectively, of FIG. 4A. The stimulus comprises a signal having the same voltage as in the example of FIG. 4E and a specified duration which is one-third the duration in the example of FIG. 4E.

The plots 401 and 461 are substantially the same and indicate the selector has a Vth and turn on voltage of Vop. The plot 460 is slightly higher than the plot 461, indicating the stimulus resulted in an incomplete forming process. Instead, the forming process is completed by the first switching operation, as demonstrated by the plot 461 of the second switching operation. The plot 400 shows the higher turn on voltage of Vinit in the first switching operation without the stimulus.

FIG. 5 depicts a table of example materials for a threshold switching selector, along with a holding threshold voltage, Vhold, and an operating threshold voltage, Vop. These are example materials for an ovonic threshold switching selector although other materials could be used. Each row of the table identifies a material, and example of a hold threshold voltage, Vhold, and an operating threshold voltage, Vop. As mentioned, Vop is the turn on voltage and Vhold is the turn off voltage. See also FIG. 6B. The example materials include Ge—Se, with Vhold=0.5 V and Vop=1.4 V; Ge—Se—N with Vhold=1.0 V and Vop=4.0 V; Ge—Se—As with Vhold=1.2 V and Vop=3.5 V; Ge—Se—Sb—N with Vhold=0.7 V and Vop=2.2 V; $Ge_{58}Se_{42}$ with Vhold=1.7 V and Vop=3.5 V; $GeTe_6$ with Vhold=0.7 V and Vop=1.6 V; Si—Te with Vhold=n.a (not available) and Vop=1.2 V; Zn—Te with Vhold=0.4 V and Vop=0.6 V; C—Te with Vhold=0.3 V and Vop=0.6 V; B—Te with Vhold=0.3 V and Vop=0.7 V; Ge—As—Te—Si—N with Vhold=1.5 V and Vop=1.8 V; and Ge—As—Se—Te—Si with Vhold=1.5 V and Vop=2.2 V.

Figure 6A:
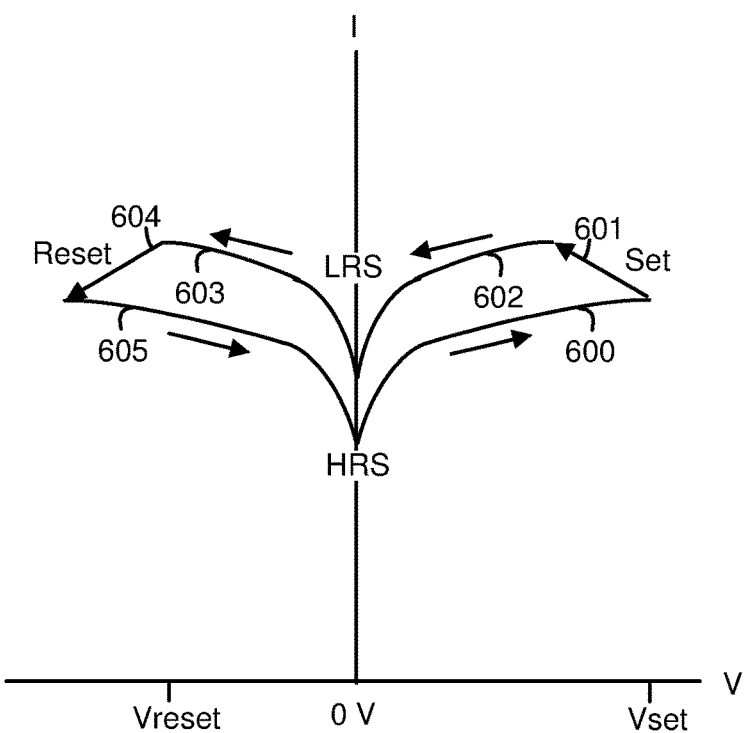
FIG. 6A depicts an example I-V plot for a bipolar switching memory cell.
Figure 6B:
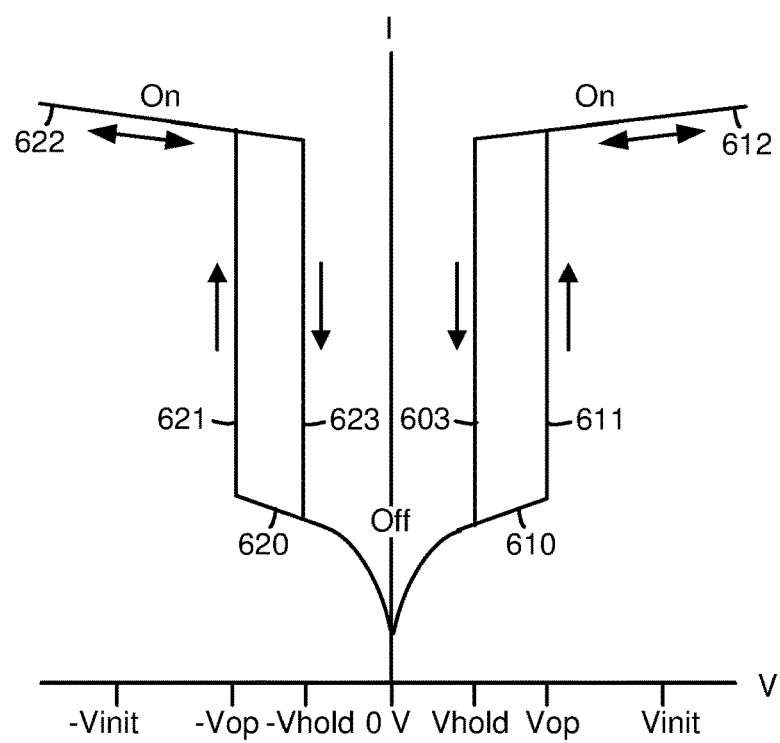
FIG. 6B depicts an example I-V plot for a threshold switching selector for use with the bipolar switching memory cell of FIG. 6A.

FIG. 6A-6C depict a current on a logarithmic scale and a voltage on a linear scale.

FIG. 6A depicts an example I-V plot for a bipolar switching memory cell. The techniques disclosed herein are suitable for use with unipolar and bipolar switching memory cells. A unipolar switching memory cell is switched between low and high resistance states by applying a voltage in one direction across the memory cell. For example, a first voltage can perform a set process for the memory cell and a second voltage can perform a reset process for the memory cell. A bipolar switching memory cell is switched from a high resistance state (HRS) to a low resistance state (LRS) in a set process by applying a positive voltage, for instance, across the memory cell, and from a LRS to a HRS in a reset process by applying a negative voltage, for instance, across the memory cell.

The I-V plot is for the memory cell, separate from the selector. The horizontal axis depicts Vset, a voltage at which a set operation occurs and Vreset, a voltage at which a reset operation occurs. Vset is greater than Vreset in magnitude in this example.

In a set operation, the memory cell is initially in the HRS. When the voltage increases from 0 V to Vset, the current increases as depicted by the plot 600. An increase in current during the set operation is depicted by the plot 601, when the memory cell is switched to the low resistance state (LRS).

Subsequently, as the voltage decreases toward 0 V, the current also decreases, as depicted by the plot 602.

In a reset operation, the memory cell is initially in the LRS. When the voltage increases in magnitude from 0 V to Vreset, the current increases as depicted by the plot 603. A decrease in current during the reset operation is depicted by the plot 604, when the memory cell is switched to the high resistance state (HRS). Subsequently, as the voltage decreases in magnitude toward 0 V, the current also decreases, as depicted by the plot 605.

FIG. 6B depicts an example I-V plot for a threshold switching selector for use with the bipolar switching memory cell of FIG. 6A. The I-V plot is for the selector, separate from the memory cell. The horizontal axis depicts the hold threshold voltage, Vhold, the operating threshold voltage, Vop, and the initial threshold voltage, Vinit. The positive and negative polarities of these voltages are depicted for use in set and reset operations, consistent with FIG. 6A.

In a set operation, when the voltage increases from 0 V to Vop, the current increases as depicted by the plot 610. When the voltage increases above Vop, the selector turns on and there is sudden increase in current as depicted by the plot 611. Subsequently, plot 612 shows that the voltage can increase or decrease with only a small change in current. This depends on the resistance of the memory cell. In most cases, the current linearly increases with the voltage. In some case, the current does not change when the voltage increases because of current compliance or the maximum measurement range is reached. When the set operation is completed, the voltage decreases to Vhold, at which point the selector turns off, resulting in a sudden decrease in current (plot 603).

In a reset operation, when the voltage increases in magnitude from 0 V to −Vop, the current increases as depicted by the plot 620. When the voltage increases in magnitude above −Vop, the selector turns on and there is sudden increase in current as depicted by the plot 621. Subsequently, plot 622 shows that the voltage can increase or decrease with only a small change in current. When the reset operation is completed, the voltage decreases in magnitude to Vhold, at which point the selector turns off, resulting in a sudden decrease in current (plot 623).

FIG. 6C depicts an example I-V plot for a storage node comprising the bipolar switching memory cell of FIG. 6A in series with the threshold switching selector of FIG. 6B. As mentioned, a signal comprising a voltage and current cannot be applied to a memory cell until the selector turns on. The voltage can be increased after the selector turns on to provide an appropriate set or reset voltage, Vset or Vreset, respectively, across the memory cell.

In a set operation, when the voltage increases from 0 V to Vop, the current increases as depicted by the plot 630. When the voltage increases above Vop, the selector turns on and there is sudden increase in current as depicted by the plot 631. The voltage can be increased further to Vset, as shown by the plot 632, at which point the set operation occurs, resulting in a sudden increase in current (plot 633). Subsequently, when the set operation is completed, plot 634 shows that the voltage decreases to Vhold, at which point the selector turns off, resulting in a sudden decrease in current (plot 635). The slope of the plot 634 representing the LRS is steeper than the slope of the plot 632 representing the HRS.

In a reset operation, when the voltage increases in magnitude from 0 V to −Vop, the current increases as depicted by the plot 640. When the voltage increases in magnitude above −Vop, the selector turns on and there is sudden increase in current as depicted by the plot 641. The voltage can be increased further to Vreset, as shown by the plot 642, at which point the reset operation occurs, resulting in a sudden decrease in current (plot 643). The slope of the plot 642 representing the LRS is steeper than the slope of the plot 644 representing the HRS. Subsequently, when the reset operation is completed, plot 644 shows that the voltage decreases in magnitude to Vhold, at which point the selector turns off, resulting in a sudden decrease in current (plot 645).

Figure 7A:
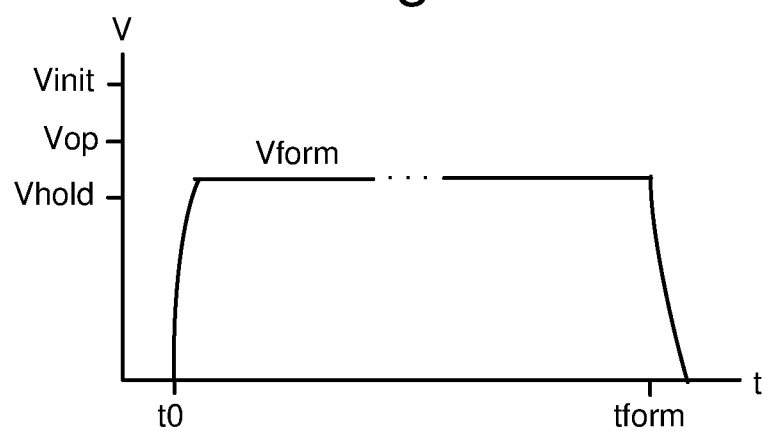
FIG. 7A depicts an example voltage versus time plot for a stimulus applied to a storage node in a forming operation.

FIG. 7A depicts an example voltage versus time plot for a stimulus applied to a storage node in a forming operation. As mentioned, the stimulus can comprise a signal having a specified current, a specified voltage below Vop or Vinit and a specified duration. The selector is not turned on in this forming operation.

The voltage may be no more than 90% of Vop in some examples. The specified duration depends on the material, structure, and fabrication process, as mentioned. The voltage is referred to as a forming voltage Vform and has a duration from t0-tform. In this example, the voltage does not exceed Vop throughout the duration. In another option, Vform is less than Vinit but greater than Vop.

Figure 7B:
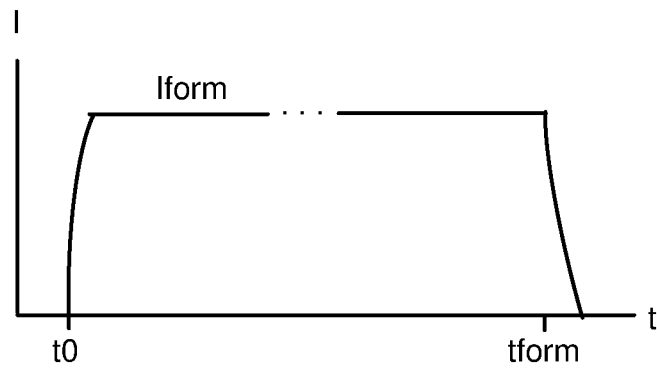
FIG. 7B depicts an example current versus time plot for a stimulus applied to a storage node in a forming operation.

FIG. 7B depicts an example current versus time plot for a stimulus applied to a storage node in a forming operation. In this example, the current has a level, Iform. The current is a fixed level in this example but can be a ramp or other varying signal.

Figure 8A:
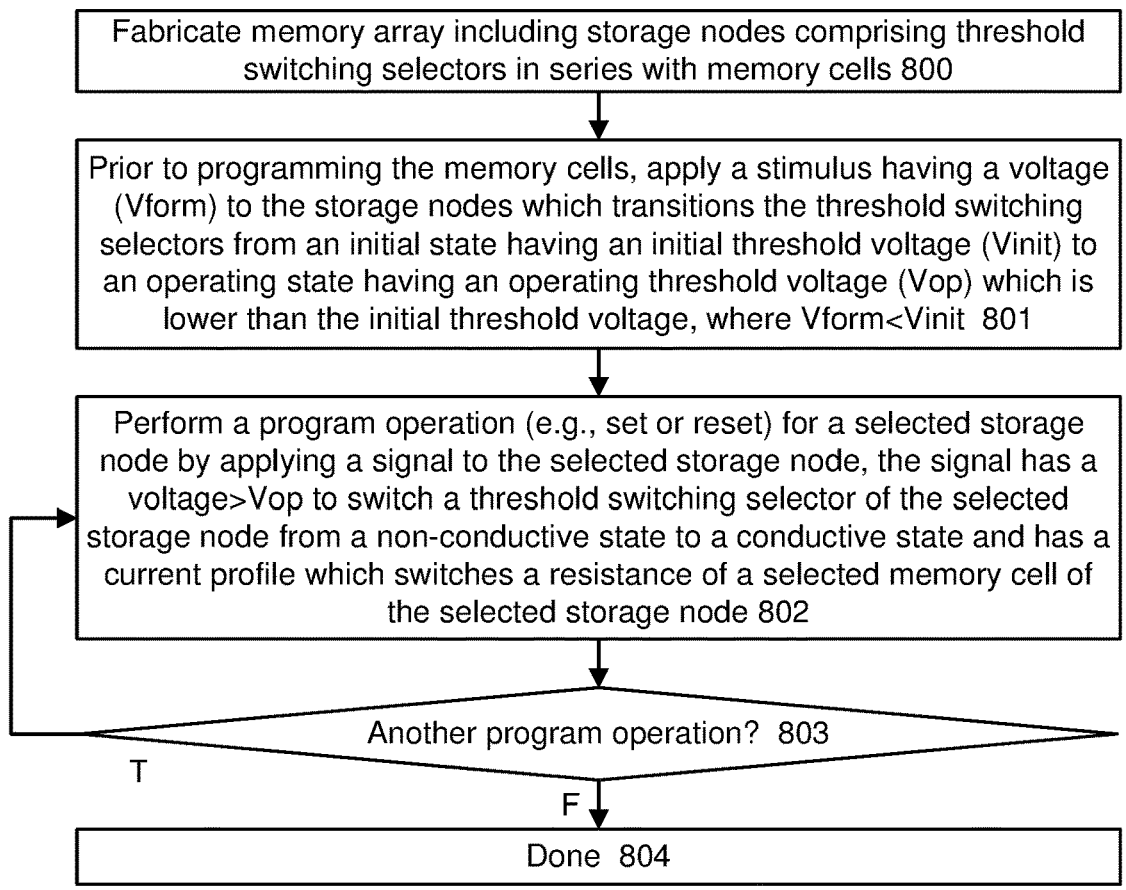
FIG. 8A depicts a flowchart of an example process for forming selectors and programming memory cells in a memory array.

FIG. 8A depicts a flowchart of an example process for forming selectors and programming memory cells in a memory array. Step 800 includes fabricating a memory array including storage nodes comprising threshold switching selectors in series with memory cells. Step 801 includes, prior to programming the memory cells, applying a stimulus having a voltage (Vform) to the storage nodes which transitions the threshold switching selectors from an initial state having an initial threshold voltage (Vinit) to an operating state having an operating threshold voltage (Vop) which is lower than the initial threshold voltage, where Vform<Vinit. Step 802 includes performing a program operation (e.g., set or reset) for a selected storage node by applying a signal to the selected storage node, where the signal has a voltage>Vop to switch a threshold switching selector of the selected storage node from a non-conductive state to a conductive state and has a current profile which switches a resistance of a selected memory cell of the selected storage node. The applying of the stimulus can occur during the wafer test or package test phase of a manufacturing process, for instance. A read operation could alternatively be performed instead of a programing operation, in which case the current may not result in resistance switching.

A decision step 803 determines if there is another program operation to perform in the array. If the decision step is true, step 802 is repeated for another selected storage node. If the decision step is false, the process is done at step 804.

Generally, step 801 transforms the threshold switching selectors from the initial state to an operating state. This can be, e.g., a transformation from a first amorphous state to a second amorphous state of the selector material such as a chalcogenide.

Figure 8B:
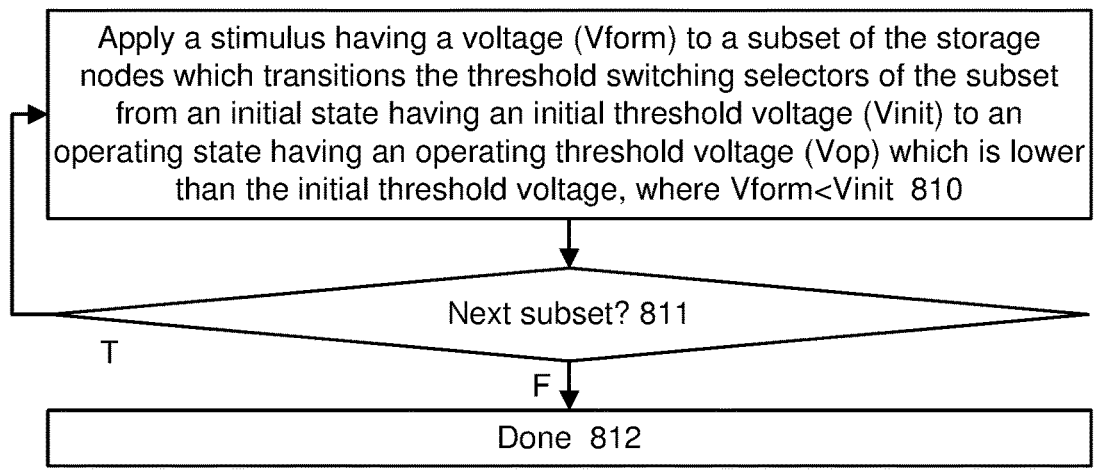
FIG. 8B depicts a flowchart of an example process for performing step 801 of FIG. 8A, where the forming of the selectors occurs one subset at a time in the memory array.

FIG. 8B depicts a flowchart of an example process for performing step 801 of FIG. 8A, where the forming of the selectors occurs one subset at a time in the memory array. As mentioned, peak current consumption can be reduced, and maintained below a maximum allowed level, by forming the selectors in different subsets of an array one subset at a time. Step 810 includes applying a stimulus having a voltage (Vform) to a subset of the storage nodes which transitions the threshold switching selectors of the subset from an initial state having an initial threshold voltage (Vinit) to an operating state having an operating threshold voltage (Vop) which is lower than the initial threshold voltage, where Vform<Vinit. A decision step 811 determines if there is a next subset in the array. If the decision step is true, step 810 is repeated for another subset of storage nodes in an array. If the decision step is false, the process is done at step 812. See also FIG. 9.

Figure 9:
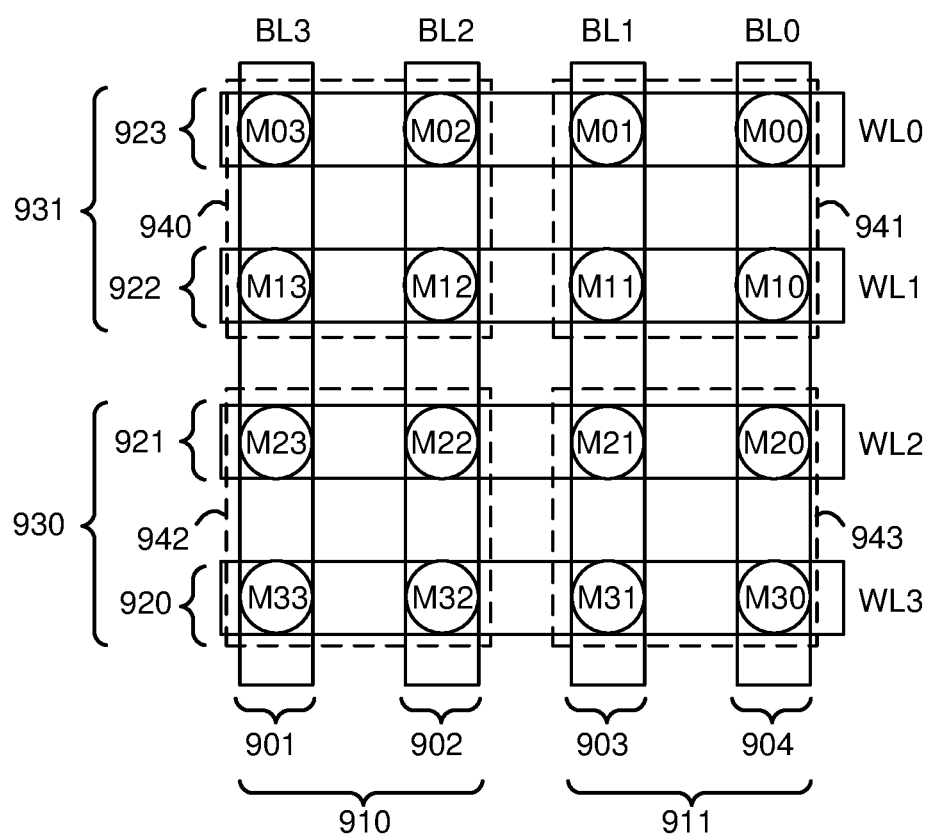
FIG. 9 depicts example subsets of storage nodes consistent with FIGS. 1B, 3 and 10B.

FIG. 9 depicts example subsets of storage nodes consistent with FIGS. 1B, 3 and 8B. A top view of the array of FIG. 1B is depicted. As mentioned, the stimulus for forming the selectors of the storage nodes can be performed for different subsets of an array at different times. For example, the subsets 901-904 each comprise a column of the array, and the subsets 910 and 911 each comprise two columns of the array. Similarly, the subsets 920-923 each comprise a row of the array, and the subsets 930 and 931 each comprise two rows of the array. In another example, the subsets 940-943 each comprise storage nodes at the intersection of two columns and two rows of the array. Other configurations of subsets are possible as well. For example, a subset could comprise all of the storage nodes in one or more columns, but only a portion of the storage nodes in one or more rows. Or, a subset could comprise all of the storage nodes in one or more rows, but only a portion of the storage nodes in one or more columns.

In another example, a subset comprises one level of a multi-level device such as in FIG. 1C. A control circuit can be configured to apply the stimulus to the multiple levels, one level at a time. In another example, a subset comprises a portion of each level in a multi-level device.

Accordingly, it can be seen that, in one implementation, an apparatus comprises: a cross-point memory array comprising a plurality of storage nodes, each storage node comprising a memory cell in series with a threshold switching selector; and a control circuit connected to the cross-point memory array, the control circuit is configured to apply a stimulus to the plurality of storage nodes to transition the threshold switching selectors from an initial state having an initial threshold voltage to an operating state having an operating threshold voltage which is lower than the initial threshold voltage, the control circuit selects multiple storage nodes concurrently, the stimulus comprising a forming voltage which does not exceed the initial threshold voltage, and the stimulus is applied for a specified period of time for forming threshold switching selectors of the multiple storage nodes.

In another implementation, a method comprises: in a first-fire of a threshold switching selector fabricated in a memory array, where the threshold switching selector is in series with a memory cell in a storage node, applying a forming voltage to the threshold switching selector, the forming voltage reduces a threshold voltage of the threshold switching selector from an initial threshold voltage to an operating threshold voltage, and the forming voltage is lower than the initial threshold voltage; and in a program operation for the memory cell, applying a signal to the storage node, the signal has a voltage which exceeds the operating threshold voltage and provides the threshold switching selector in a conductive state, and a current profile which switches a resistance of the memory cell.

In another implementation, an apparatus comprises: a control circuit configured to apply a stimulus to threshold switching selectors in a cross-point memory array prior to a first switching operation in a lifetime of the cross-point memory array, the stimulus is configured to reduce a threshold voltage of the threshold switching selectors from an initial threshold voltage to an operating threshold voltage, the stimulus comprising a voltage which does not exceed the initial threshold voltage.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

I claim:

1. An apparatus, comprising:
a cross-point memory array comprising a plurality of storage nodes, each storage node comprising a memory cell in series with a threshold switching selector; and
a control circuit connected to the cross-point memory array, the control circuit is configured to apply a stimulus to the plurality of storage nodes to transition the threshold switching selectors from an initial state having an initial threshold voltage to an operating state having an operating threshold voltage which is lower than the initial threshold voltage, the control circuit selects multiple storage nodes concurrently, the stimulus comprising a forming voltage which does not exceed the initial threshold voltage, and the stimulus is applied for a specified period of time for forming threshold switching selectors of the multiple storage nodes.

2. The apparatus of claim 1, wherein:
the forming voltage does not exceed the operating threshold voltage.

3. The apparatus of claim 1, wherein:
after applying the stimulus to the plurality of storage nodes prior, the control circuit is configured to apply a signal to a selected storage node of the plurality of storage nodes, the signal has a voltage which is higher in magnitude than the operating threshold voltage to switch a threshold switching selector of the selected storage node from a non-conductive state to a conductive state and has a current profile which switches a resistance of a selected memory cell of the selected storage node.

4. The apparatus of claim 1, wherein:
the specified period of time is at least one microsecond.

5. The apparatus of claim 1, wherein:
the specified period of time is at least one millisecond.

6. The apparatus of claim 1, wherein:
the specified period of time is at least one second.

7. The apparatus of claim 1, wherein:
the control circuit is configured to apply the stimulus to different subsets of the plurality of storage nodes, one subset at a time.

8. The apparatus of claim 1, wherein:
the plurality of storage nodes are arranged in a plurality of rows and a plurality of columns; and
the control circuit is configured to apply the stimulus to different subsets of the rows, one subset at a time.

9. The apparatus of claim 1, wherein:
the plurality of storage nodes are arranged in a plurality of rows and a plurality of columns; and the control circuit is configured to apply the stimulus to different subsets of the columns, one subset at a time.

10. The apparatus of claim 1, wherein:
the plurality of storage nodes are arranged in multiple levels; and
the control circuit is configured to apply the stimulus to the multiple levels, one level at a time.

11. The apparatus of claim 1, wherein:
the threshold switching selectors of the plurality of storage nodes comprise a chalcogenide;
the initial state is a first amorphous state of the chalcogenide; and
the operating state is a second amorphous state of the chalcogenide.

12. The apparatus of claim 1, wherein:
the transition of the threshold switching selectors of the plurality of storage nodes from the initial state to the operating state is irreversible in normal operation/storage conditions.

13. A method, comprising:
in a first-fire of a threshold switching selector fabricated in a memory array, where the threshold switching selector is in series with a memory cell in a storage node, applying a forming voltage to the threshold switching selector, the forming voltage reduces a threshold voltage of the threshold switching selector from an initial threshold voltage to an operating threshold voltage, and the forming voltage is lower than the initial threshold voltage; and
in a program operation for the memory cell, applying a signal to the storage node, the signal has a voltage which exceeds the operating threshold voltage and provides the threshold switching selector in a conductive state, and a current profile which switches a resistance of the memory cell.

14. The method of claim 13, wherein:
the forming voltage irreversibly transforms the threshold switching selector from a first amorphous state having the initial threshold voltage to a second amorphous state having the operating threshold voltage in normal operation/storage conditions.

15. The method of claim 13, wherein:
the storage node is in a cross-point memory array comprising a plurality of storage nodes, each storage node comprising a threshold switching selector in series with a memory cell; and
a signal comprising the forming voltage is applied to different subsets of the plurality of storage nodes, one subset at a time, to reduce threshold voltages of the threshold switching selectors of the different subsets while maintaining a peak current consumption below a maximum allowed level.

16. An apparatus, comprising:
a control circuit configured to apply a stimulus to threshold switching selectors in a cross-point memory array prior to a first switching operation in a lifetime of the cross-point memory array, the stimulus is configured to reduce a threshold voltage of the threshold switching selectors from an initial threshold voltage to an operating threshold voltage, the stimulus comprising a voltage which does not exceed the initial threshold voltage.

17. The apparatus of claim 16, wherein:
each threshold switching selector is in series with a memory cell in a storage node of the cross-point memory array; and
to perform the first switching operation, the control circuit is configured to apply a voltage to a threshold switching selector in the cross-point memory array which turns on the threshold switching selector, and to apply a current to a selected memory cell which changes a resistance state of the selected memory cell.

18. The apparatus of claim 16, wherein:
the control circuit is configured to apply the stimulus to different subsets of word lines and/or bit lines of the cross-point memory array, one subset at a time.

19. The apparatus of claim 16, wherein:
the control circuit is configured to apply the stimulus to different subsets of the threshold switching selectors of the cross-point memory array, one subset at a time.

20. The apparatus of claim 16, wherein:
the stimulus comprising a voltage which does not exceed the operating threshold voltage.

* * * * *